PROVIDE PREPARED ELEMENT SURFACE FOR RECEIVING THE NEGATIVE AND POSITIVE PHOTORESIST

FIG. 1

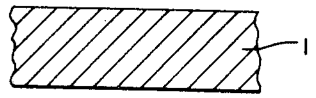

APPLY NEGATIVE PHOTORESIST, ATTACH NEGATIVE FILM AND EXPOSE PHOTORESIST

FIG. 2

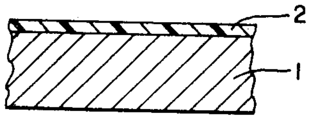

REMOVE NEGATIVE FILM, DEVELOP AND REMOVE UNEXPOSED NEGATIVE PHOTORESIST

FIG. 3

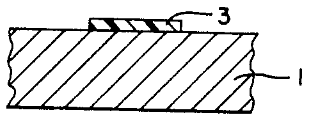

APPLY POSITIVE PHOTORESIST, ATTACH AND OVERLAY POSITIVE FILM AND EXPOSE PHOTORESIST

FIG. 4

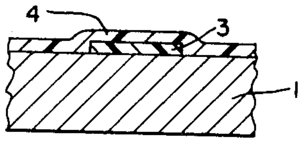

REMOVE POSITIVE FILM, DEVELOP AND REMOVE EXPOSED POSITIVE PHOTORESIST

FIG. 5

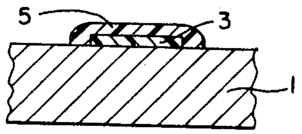

ETCH UNPROTECTED SURFACES

FIG. 6

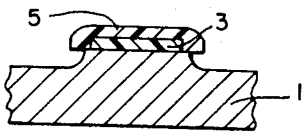

REMOVE POSITIVE PHOTORESIST

FIG. 7

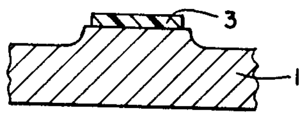

ETCH UNPROTECTED SURFACES

FIG. 8

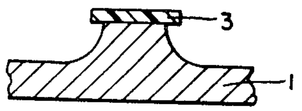

June 5, 1973 R. L. RULEFF ET AL 3,737,314

MANUFACTURE OF PRINTING ELEMENTS BY A PHOTORESIST CHEMICAL ETCHING SYSTEM

Original Filed July 8, 1970

2 Sheets-Sheet 2

1

3,737,314

MANUFACTURE OF PRINTING ELEMENTS BY A PHOTORESIST CHEMICAL ETCHING SYSTEM

Robert L. Ruleff, Kettering, William P. Lee II, Tipp City, Jay W. Childress, Dayton, and Donald H. Knapke, Troy, Ohio, assignors to The National Cash Register Company, Dayton, Ohio Continuation of abandoned application Ser. No. 53,151, July 8, 1970. This application Feb. 29, 1972, Ser. No. 230,536

Int. Cl. G03c *5/00;* G03f *7/00*

U.S. Cl. 96—36.3 11 Claims

ABSTRACT OF THE DISCLOSURE

This process comprises the use of two dissimilar photoresist images. The top photoresist image is superimposed over and extends beyond the bottom photoresist image. The top photoresist image functions as a resist while acid etching a pattern which is larger than required. The top photoresist image is then removed. The bottom photoresist image remains in place and functions as a resist while acid etching the final and well-defined pattern.

This is a continuation of application Ser. No. 53,151, filed July 8, 1970.

BACKGROUND OF THE INVENTION

This invention relates to a process for etching metal. More particularly this invention relates to an improved process for producing a relief in the surface of a metal, which is soluble in an acid by means of a negative photosensitive material (negative photoresist) and a positive photosensitive material (positive photoresist) and their respective negative and positive photographic films.

In the conventional method of making a metal printing surface in relief, as in making a photoengraving of an acid-soluble metal, such as copper, iron, magnesium, steel, zinc, and the like and their alloys, a photosensitive material, coating or enamel is applied to the metal surface which is usually flat or cylindrical. The coated surface is exposed to light through a negative having an image therein so as to produce a corresponding image in the coating. The exposed coated surface is developed thereby forming an acid-resistant coating in the form of the image produced by the exposure. The acid-resistant coating, which is referred to as a photoresist or a resist, is usually further hardened as by a hardening treatment such as curing which increases its resistance to the etching acid. The surface of the metal bearing the so-prepared photoresist is then subjected to etching by an acid.

The etching is usually carried out with a conventional inorganic acid such as hydrochloric, nitric, sulfuric and the like or an acid salt thereof suitably diluted with water, the acid solution being usually splashed or otherwise impinged against the object. The acid attacks the bare portions of the metal, that is, the portions of the metal object unmasked of the photoresist in the developing operation. The rest of the metal surface is protected by the photoresist from direct attack by the acid which does not penetrate the photoresist. As the etching proceeds, metal from the bare portions of the object dissolves away leaving the image in vertical relief. While the relief is being thus formed, the metal of the relief is attached in a lateral direction and the resist will become undesirably undercut around its edges if the etching operation is continued too long without protecting the sides of the relief from lateral attack. Before a significant amount of the metal forming the relief is dissolved away by lateral attack, it is conventional practice to rinse off the etching solution, dry the rinsed object, and then treat the dried object so as to protect the metal in relief from lateral attack by the acid before proceeding with a further etching operation. One method of providing this protection is to powder the object in each of the four planar directions with an acid-resisting powder material called etching powder so as to coat with powder all sides of the portions of the metal in relief. After each powdering in each direction, the powder is burned in, that is, the powdered etched object is heated to fuse and fix the acid resisting material in place as an acid resistant deposit. The object thus protected by the powdering, or otherwise, is then given a second etch. This second etching operation, performed like the first, increases the depth of the prior etch without attack on the metal already in relief, the sides of which are protected from the acid by the burned-in etching powder.

The second etching operation, like the first, is stopped before an excessive amount of attack is produced on the sides of the portion of the relief newly formed by the second etch below the protected portion of the relief formed in the first etch. The etched object is again rinsed, dried and given another protective treatment as by powdering so as to form an acid-resisting deposit on all sides of the newly formed portion of the relief. The object is then ready for a third etching operation which is carried out in a manner similar to the preceding ones, followed by rinsing, drying, powdering, and burning-in if still another etch is to be done. The object is thus alternatively subjected to etching, protecting of the relief and re-etching so as to accentuate the relief while restraining attack by the acid on the image-supporting metal in relief until a sufficient depth of etch is produced on the surface of the object not coated with resist, to meet printing requirements. The number of etches made by the acid or bites, as these etches are called in the trade, is usually three, four or five depending upon the character of the image and the depth of etch required. The foregoing steps are well known in the art and are practiced in various ways best adapted to the work in hand.

Although the acid etches away the bare metal rapidly, the time taken for the entire operation of completing the preparation of a relief, as for a printing surface, when several bites are required is inordinately large. This is due mainly to the numerous time-consuming steps of rinsing, drying and protecting the relief which are required between each bite of the etchant to prevent undercutting of the image while obtaining a sufficient depth of etch for the purpose in hand and are more time-consuming than the etching operation itself.

The present invention overcomes the difficulties encountered in the prior art and provides an improved process for making printing plates or cylinders which is equally applicable to half tone and for line work, which is relatively simple and inexpensive to carry out, which is expeditious and which produces line work having sharp, clear-cut edges and half-tone dots which are well defined and are accurately graduated from high-light dots, through the middle tones, to the deep shadow portions.

PRIOR ART

United States Patent 2,331,772 to Gibson discloses a process wherein a photographic image, which is an accurate reproduction of the object to be printed, is formed on a printing plate made of a suitable material, preferably zinc, copper or other metal. A second photographic image, which is similar to but in which each line and half-tone dot is slightly larger than the corresponding line and half-tone dot in the original image is then superimposed over the first image. The printing plate is then placed in an etching bath and is left there for a sufficient time to take a deep bits out of all portions thereof which are outside of the second image. The coating material forming the second image is then removed and the first image is left on the printing plate. The printing plate is then placed in an etching bath and is left there for a sufficient time to take a bits in the portions of the plate outside the first image. This patent also discloses that deeper etches can be obtained by processes of the prior art.

U.S. Pats. 1,888,303; 1,903,778; 2,062,028; 2,411,109; 2,640,763; 2,647,864; 2,701,186; 2,704,512; 2,763,536; 2,865,750; 2,907,657; 2,977,227; 3,006,796; 3,161,552 disclose fragments of the process of the present invention but do not disclose the entire novel process of the present invention.

SUMMARY OF THE INVENTION

In accordance with the invention there is provided a process for producing a metal printing element which comprises coating the element to be etched with a substantially uniform layer of a negative-acting photosensitive etchant resin. A negative photographic film pattern is then layed on the element to be etched. The element is then exposed ultraviolet light and the photographic film pattern is then removed. The negative photoresist is then developed and the unexposed portion is removed. The element to be etched is then coated with a substantially uniform layer of a positive-acting photosensitive etchant resist. A positive photographic film pattern is overlayed on the element containing the negative photoresist image. The element is then exposed to ultraviolet light and the photographic film pattern is then removed. The positive photoresist is then developed and the exposed portion is removed. The element is then etched with an acid etching solution to etch to a partial desired depth. The positive photoresist layer is then removed. The element is then etched with an acid etching solution to etch to a final depth. The negative photoresist layer is then removed and the printing element is finished as is necessary.

DESCRIPTION OF THE DRAWING

FIG. 1 is a cross-sectional view showing element 1 prepared to be coated with the two photoresists.

FIG. 2 is a cross-sectional view showing element 1 coated with negative photoresist layer 2.

FIG. 3 is a cross-sectional view showing element 1 coated with developed negative photoresist layer 3.

FIG. 4 is a cross-sectional view showing element 1 coated with positive photoresist layer 4 over developed negative photoresist layer 3.

FIG. 5 is a cross-sectional view showing element 1 coated with developed positive photoresist layer 5 over developed negative photoresist layer 3.

FIG. 6 is a cross-sectional view showing the first etch bite.

FIG. 7 is a cross-sectional view of element 1 showing positive photoresist layer 5 removed.

FIG. 8 is a cross-sectional view showing the final etch bite.

PREFERRED EMBODIMENTS

Figure 9:

The following example illustrates the present invention and a mode of carrying out the invention.

EXAMPLE

An AISI A–2 Type Tool Steel drum was rough machined. The steel drum was then rough ground, stress relieved, and then precision ground to an outside diameter of 3¼ inches, an inside diameter of 2⅞ inches and a length of 15 inches. Scribe locating marks were then made on the surface of the drum for future location of artwork which will later be described in detail. Traces of oil were removed from the surface of the steel drum by washing the drum in methyl ethyl ketone.

The steel drum was then rinsed with water. The surface of the steel drum was then thoroughly scrubbed using Shipley No. 70 Scrub Cleaner in conjunction with water and a power scrubber. Shipley No. 70 Scrub Cleaner is a trade name for a cleaner which comprises a combination of citric acid and wetting agents in a pumice base, and which is manufactured by the Shipley Company, Inc., Newton, Mass., U.S.A. The steel drum was then rinsed thoroughly with water and was blown dry with an air hose.

The steel drum was then immersed in an aqueous phosphoric acid bath for about 50 to 60 seconds and was then quickly removed and rinsed with water. The aqueous phosphoric acid bath contained a concentration of 5.25 to 6.25 normal phosphoric acid and was maintained at a temperature of about 165 to 172 degrees F. The steel drum was then thoroughly spray rinsed with water and was blown dry with an air hose.

The acid treated steel drum was then baked in an oven at 170 degrees F. for 5 minutes. The steel drum was then removed from the oven and allowed to cool to room temperature. Cross-section 1 of the pretreated steel drum ready for use in the process of the invention is shown in FIG. 1.

The longitudinal axis of the steel drum was vertically suspended by means of a rack and a hook attached to the top of one end of the steel drum so that the outer surface of the drum was free and clear of any suspension or holding means. The steel drum was slowly lowered into a negative photoresist, namely, Eastman Kodak, KMER Photoresist until the steel drum was completely immersed in the negative photoresist and the steel drum then was allowed to set immersed for 1 minute. The steel drum was then slightly raised out of the negative photoresist at a rate of 0.5 inch per minute until the top of the steel drum was ⅛ inch above the surface of the negative photoresist and the steel drum then was allowed to set in this position for 1 minute. The steel drum was then lowered into the negative photoresist at a rate of 0.5 inch per minute until the steel drum was completely immersed in the negative photoresist and the steel drum then was allowed to set immersed for 10 seconds. The steel drum was then raised out of the negative photoresist at a rate of 1.4 inches per minute until the steel drum was no longer immersed in the negative photoresist. The bottom of the steel drum was then blotted by means of an absorbent tissue paper. Eastman Kodak KMER Photoresist used in this example is a tradename for a negative photoresist, marketed by the Eastman Kodak Company, Rochester, N.Y., U.S.A., which comprises a low molecular weight cis-1,4-polyisoprene and a diazide sensitizer in a xylene solvent system. The negative photoresist had a viscosity of 23.4 to 23.6 seconds as measured by a Zahn No. 3 Cup and a solids content of 24.6±0.2 percent by weight and was maintained at a temperature of about 70 degrees F. After the steel drum was removed from the negative photoresist, it was air dried at room temperature for 20 minutes. The negative photoresist on the steel drum was then cured in an oven at 250 degrees F. for 20 minutes. The steel drum was then removed from the oven and allowed to cool to room temperature. The thickness of the negative photoresist on the steel drum was checked using a Microderm and the negative photoresist coating had an acceptable thickness range of between 0.36 and 0.40 mil. Microderm is a trademark for a beta ray back scatter thickness measuring device. The microderm was manufactured by Unit Process Assemblies, Inc., Woodside, N.Y., U.S.A. The cross-section of the coating of negative photoresist is shown in layer 2 of FIG. 2.

Figure 10:
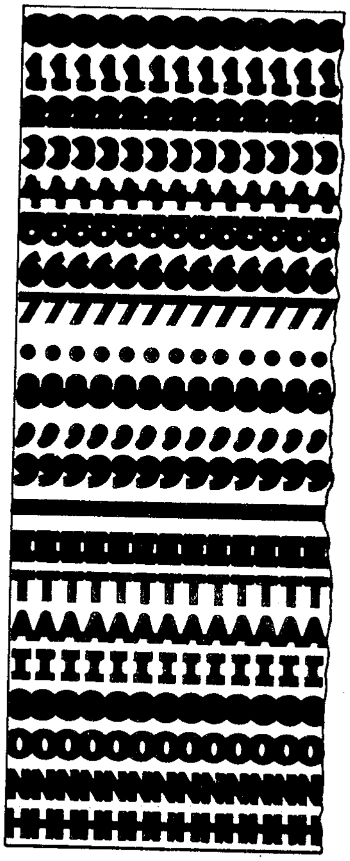

The films shown in FIGS. 9 and 10 were prepared in accordance with conventional photographic techniques. The film shown in FIG. 9 is a negative film of the images desired to be formed on the steel drum. The film shown in FIG. 10 is a positive film of the images desired to be formed on the steel drum. Glass master plates were prepared for the films and the glass master plates contained the desired size and shape of the images which appear on the negative and positive films shown in FIGS. 9 and 10.

The negative film shown in FIG. 9 was positioned on the steel drum using the scribe locating marks which were placed on the steel drum and described earlier. The negative film was then secured to the steel drum using transparent plastic tape. The negative film was positioned on the steel drum with the emulsion side of the film in contact with the surface of the steel drum. The ends of the steel drum were protected from ultraviolet light exposure by covering with ¼ inch wide lithography tape. The area between the two film ends was protected from ultraviolet light exposure by covering it with 0.025 inch wide opaque tape.

The steel drum containing the negative photoresist and the negative film was attached to an exposing arbor and an ultraviolet light was positioned to expose the negative photoresist. The steel drum was then rotated by the exposing arbor. The rotating steel drum containing the negative photoresist and the negative film was then exposed to an ultraviolet light using a Nu Arc Exposing Lamp. The Nu Arc Exposing Lamp contains a General Electric PXA xenon gas filled bulb and is manufactured by the Nu Arc Company, Inc., Chicago, Ill., U.S.A. The ultraviolet light exposure was for 8.5 minutes or a step break between 5 and 6 on Kodak Photographic Step Tablet No. 2. The ultraviolet light output of the Nu Arc Exposing Lamp was determined using an International Light Photoresist Photometer No. 1L411T manufactured by International Light Inc., Newburyport, Mass., U.S.A. Sample intensity readings were taken using a No. SC100A Sensor with a ½ inch diameter aperture. Typical readings were 0.057 microwatt per square centimeter on the No. 3 Scale when the aperture of the sensor was placed 23.5 inches from the light source. The No. SC100A Sensor is manufactured by International Light Inc., Newburyport, Mass., U.S.A.

After the negative photoresist on the steel drum was exposed to the ultraviolet light, the steel drum was removed from the exposing arbor and the negative film was removed from the steel drum. The steel drum was then placed on one end in a spray development tank and the steel drum containing the exposed negative photoresist was sprayed in a circular downward pattern with a negative photoresist developer, namely, Eastman Kodak KMER Developer, for 35 seconds. The steel drum was then inverted in the tank and the steel drum containing the exposed negative photoresist was sprayed in a circular downward pattern with the same negative photoresist developer described above for 35 seconds. The Eastman Kodak KMER Developer used in this example is a tradename for a negative photoresist developer, marketed by the Eastman Kodak Company, Rochester, N.Y., U.S.A., which comprises a solvent mixture of xylene and Stoddard solvent. The steel drum was then rinsed in running water for 2 to 3 minutes and then gently dried with compressed air. The steel drum was then air dried for about 2 hours. A cross-section of the developed negative photoresist is shown in layer 3 of FIG. 3.

The longitudinal axis of the steel drum was vertically suspended by means of a rack and a hook attached to the top of one end of the steel drum so that the outer surface of the drum was free and clear of any suspension of holding means. The steel drum was slowly lowered into a positive photoresist, namely, Shipley AZ–345 Photoresist until the steel drum was completely immersed in the positive photoresist and the steel drum then was allowed to set immersed for 15 seconds. The steel drum was then slightly raised out of the positive photoresist at a rate of 0.5 inch per minute until the top of the steel drum was 1½ inches above the surface of the positive photoresist and the steel drum then was allowed to set in this position for 5 to 10 seconds. The steel drum was then lowered into the positive photoresist at a rate of 0.5 inch per minute until the steel drum was completely immersed in the positive photoresist and the steel drum then was allowed to set immersed for 15 seconds. The above-described steps of raising the steel drum until the top of the drum was 1½ inches above the surface of the positive photoresist, allowing the steel drum to set in this position and lowering the steel drum back into the positive photoresist was repeated three times. The steel drum was then raised out of the positive resist at a rate of 6.5 inches per minute until the steel drum was no longer immersed in the positive photoresist. The bottom of the steel drum was then blotted by means of an absorbent tissue paper. The Shipley AZ–345 Photoresist used in this example is a tradename for a positive photoresist, marketed by the Shipley Company, Inc., Newton, Mass., U.S.A., which comprises diazide photosensitive polymers in a Cellosolve acetate solvent system. The positive photoresist had a solids content of about 22 percent by weight and was maintained at a temperature of about 70 degrees F. After the steel drum was removed from the positive photoresist, it was air dried at room temperature for 5 minutes. The positive photoresist on the steel drum was then cured in an oven at 170 degrees F. for 20 minutes. The steel drum was then removed from the oven and allowed to cool to room temperature. A cross-section of the coating of positive photoresist and negative photoresist is shown in layers 4 and 3, respectively, in FIG. 4.

The positive film shown in FIG. 10 was positioned on the steel drum using the scribe locating marks which were placed on the steel drum and described earlier. The positive film was then secured to the steel drum using transparent plastic tape. The positive film was positioned on the steel drum with the emulsion side of the film in contact with the surface of the steel drum. The ends of the steel drum and the area between the two film ends were not protected from ultraviolet light exposure by any taping means.

The steel drum containing the developed negative photoresist, the positive photoresist and the positive films was attached to an exposing arbor and an ultraviolet light was positioned to expose the positive photoresist. The steel drum was then rotated by the exposing arbor. The rotating steel drum containing the positive photoresist and the positive film was then exposed to an ultraviolet light using a Nu Arc Exposing Lamp. The ultraviolet light exposure was for 12 minutes or a step break between 4 and 5 on Kodak Photographic Step Tablet No. 2. The ultraviolet light output of the Nu Arc Exposing Lamp was determined using an International Light Photoresist Photometer No. 1L411T, manufactured by International Light Inc., Newburyport, Mass., U.S.A. Sample readings were taken in accordance with the procedures described above.

After the positive photoresist on the steel drum was exposed to the ultraviolet light, the steel drum was removed from the exposing arbor and the positive film was removed from the steel drum. The steel drum was then immersed in a positive photoresist developer, namely, Shipley AZ–303 Developer, for about 1 to 1½ minutes or until the image had cleared. The Shipley AZ–303 Developer used in this example is a trade name for a positive photoresist developer, marketed by the Shipley Company Inc., Newton, Mass., U.S.A., which comprises an aqueous alkali metal caustic solution having a caustic concentration of 0.33 to 0.35 normal and maintained at a temperature of about 70 degrees F. The steel drum was then rinsed in running water for 2 to 3 minutes and then gently dried with compressed air. The steel drum was then air dried for 15 minutes. A cross-section of developed positive photoresist and developed negative resist is shown, respectively, in layers 5 and 3 in FIG. 5.

The steel drum was then placed on an etching fixture and positioned in a spray etching chamber. Care was taken to first protect the ends of the steel drum with platers tape. Care was also taken to ensure that the spray nozzle pattern covered the entire surface of the steel drum. The acid etching solution comprised an aqueous solution of ferrous and ferric chlorides containing 2.8 to 3.6 percent by weight of ferrous ions and 9.8 to 10.4 percent by weight of ferric ions. The etching solution was sprayed into the etching chamber under a pressure of 45 p.s.i.g. and at a temperature of 130 degrees F. Prior to spraying of the etching solution into the etching chamber, the oscillation and rotational movement of the etching fixture holding the steel drum was started. The etching spray and timer were then started and the etching spray was maintained on the steel drum for about 3 minutes which resulted in the first etch bite of 5 mils depth into the steel drum. The steel drum was then removed from the etching chamber and the etching fixture and was rinsed thoroughly with water and gently dried with compressed air. A cross-section of the first etch bite is shown in FIG. 6.

The steel drum was then immersed in a 7.1 to 7.5 normal sodium hydroxide solution at a temperature of 130 to 140 degrees F. for 1 to 1½ minutes to remove the positive resist. The steel drum was then thoroughly rinsed with water and gently dried with compressed air. A cross-section of the first etch bite after removal of the positive photoresist is shown in FIG. 7.

The steel drum was then placed on the etching fixture and again positioned in the spray etching chamber in accordance with the procedure described above. The same etching solution as described above was used under the same spray conditions. The etching spray and timer were then started and the etching spray was maintained on the steel drum for about 6 minutes which resulted in a second etch bite of 10 additional mils depth into the steel drum or a total etch bite from the two etches of 15 mils depth into the steel drum. The steel drum was then removed from the etching chamber and the etching fixture and was rinsed thoroughly with water and gently dried with compressed air and was maintained at a temperature of about 70 degrees F. A cross-section of the final etch bite after the removal of the positive photoresist is shown in FIG. 8.

The negative photoresist was removed from the etched steel drum by immersing the steel drum in a composition comprising xylene, methylene chloride and methyl Cellosolve acetate solvents in an acidic solution for about 5 minutes. This composition is marketed by MacDermid Incorporated, Waterbury, Conn., U.S.A. under the trade name of MacDermid No. 682 Resist Stripper.

The steel drum was then rinsed with water. The surface of the steel drum was then thoroughly scrubbed using Shipley No. 70 Scrub Cleaner in conjunction with water and a power scrubber. The steel drum was then rinsed thoroughly with water and was blown dry with an air hose.

The etched steel drum was then heat treated and tempered to obtain a hardness of 58 to 60 as measured on the Rockwell C Hardness scale.

The etched steel drum was then finished using conventional procedures which included deburring and the application of a protective coating.

Other suitable metals which can be etched by the process of the present invention include aluminum, copper, iron, magnesium, steel, zinc and the like and alloys thereof.

Other suitable etchants which can be used in the process of the present invention include ammonium persulfate, chrome-sulfuric acid, cupric chloride, ferric chloride, hydrochloric acid, nitric acid and the like and mixtures thereof.

It is claimed:

1. A process for producing a metal printing element which comprises coating the element to be etched with a substantially uniform layer of a negative acting photosensitive etchant resist; laying a negative photographic film pattern to the element to be etched, exposing the negative photoresist to ultraviolet light, removing the film, and developing the negative photoresist by removing the unexposed portion of the negative photoresist; coating the element to be etched with a substantially uniform layer of a positive-acting photosensitive etchant resist; overlaying a positive photographic film pattern on the element containing the negative photoresist image, exposing the positive photoresist to ultra-violet light, removing the film, and developing the positive photoresist by removing the exposed portion of the positive photoresist; treating the element with an acid etching solution to etch to a first partial desired shallow depth; removing the positive photoresist layer; treating the element with acid etching solution to etch to a second final deeper depth; removing the negative photoresist layer; and finishing the element as is necessary.

2. The process of claim 1 wherein the element is steel

3. The process of claim 1 wherein the negative photoresist comprises a low molecular weight cis-1,4-polyisoprene and a diazide sensitizer in a xylene solvent system.

4. The process of claim 1 wherein the negative photoresist is developed by contact with a developer comprising a solvent mixture of xylene and stoddard solvent.

5. The process of claim 1 wherein the positive photoresist comprises diazide photosensitive polymers in a Cellosolve acetate solvent system.

6. The process of claim 1 wherein the positive photoresist is developed by contact with a developer comprising an aqueous alkali metal caustic solution.

7. The process of claim 1 wherein the acid etching solution is an aqueous solution of ferrous and ferric chlorides.

8. The process of claim 1 wherein the positive photoresist is removed by contacting the element with a hot caustic solution.

9. The process of claim 8 wherein the caustic is sodium hydroxide.

10. The process of claim 1 wherein the negative photoresist is removed by contacting the element with a composition comprising xylene, methylene chloride and methyl Cellosolve acetate solvents in an acidic solution.

11. The process of claim 1 wherein the first partial desired shallow depth is 5 mils and the second final deeper depth is 15 mils.

References Cited

UNITED STATES PATENTS

| | | | |
|---|---|---|---|
| 2,331,772 | 10/1943 | Gibson | 96—36.3 |
| 3,006,796 | 10/1961 | Bridwel | 96—36 |
| 3,483,615 | 12/1969 | Gottfried | 156—11 |
| 3,620,736 | 11/1971 | Tarkington | 96—36 |

DAVID KLEIN, Primary Examiner

U.S. Cl. X.R.

156—11; 96—36, 36.2